(12) United States Patent
Imai et al.

(10) Patent No.: US 6,605,853 B2
(45) Date of Patent: Aug. 12, 2003

(54) SEMICONDUCTOR DEVICE HAVING HEAT PROTECTION CIRCUITS

(75) Inventors: Hiroshi Imai, Kariya (JP); Hirokazu Itakura, Hazu-gun (JP); Hiroyuki Ban, Hazu-gun (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 09/909,878

(22) Filed: Jul. 23, 2001

(65) Prior Publication Data

US 2002/0014639 A1 Feb. 7, 2002

(30) Foreign Application Priority Data

Jul. 25, 2000 (JP) .................................. 2000-224088

(51) Int. Cl.⁷ ............................................. H01L 31/058
(52) U.S. Cl. ........................................ 257/469; 257/470
(58) Field of Search .................................. 257/469, 470

(56) References Cited

U.S. PATENT DOCUMENTS

| | | | |
|---|---|---|---|
| 4,896,199 A | 1/1990 | Tsuzuki et al. | 307/310 |
| 5,521,421 A * | 5/1996 | Furuhata | 257/467 |
| 5,672,894 A | 9/1997 | Maeda et al. | 257/343 |
| 5,828,112 A * | 10/1998 | Yamaguchi | 257/378 |

FOREIGN PATENT DOCUMENTS

| | | |
|---|---|---|
| JP | 7050389 | 2/1995 |
| JP | 57040977 | 1/1997 |
| JP | 10038964 | 2/1998 |
| JP | 11220034 | 8/1999 |
| JP | 11340459 | 12/1999 |

OTHER PUBLICATIONS

US 6,104,076, 8/2000, Nakayama et al. (withdrawn)

U.S. patent application Ser. No.: 09/836,473 Koyama et al, filed Apr. 18, 2001.

* cited by examiner

*Primary Examiner*—Phat X. Cao
(74) *Attorney, Agent, or Firm*—Posz & Bethards, PLC

(57) ABSTRACT

A semiconductor device has plural output circuits. Each of the plural output circuits has a semiconductor switching element and a heat protection circuit including a diode. When the heat protection circuit in a predetermined output circuit detects that heat emitted from the semiconductor switching element in the predetermined output circuit, the heat protection circuit turns off the semiconductor switching element in the predetermined output circuit. The plural output circuits are thermally isolated from each other by a trench and an insulation film. The trench and the insulation film prevent the heat from being transmitted from the predetermined output circuit to an adjacent output circuit. Therefore, even if the heat, by which the semiconductor switching element in the predetermined output circuit is turned off, is generated at the predetermined output circuit, the semiconductor switching element in the adjacent output circuit is not turned off by the heat.

13 Claims, 4 Drawing Sheets

SEMICONDUCTOR DEVICE HAVING HEAT PROTECTION CIRCUITS

CROSS REFERENCE TO RELATED APPLICATIONS

This application is based upon Japanese Patent Application No. 2000-224088 filed on Jul. 25, 2000, the contents of which are incorporated herein by reference.

BACKGROUND OF THE INVENTION

1. Field of the Invention

This invention relates to a semiconductor device having a heat protection circuit.

2. Description of the Related Art

Recently, a semiconductor device having heat protection circuits has been proposed. In such a kind of the semiconductor device, an output transistor, as an output portion, is provided to apply current to a load such as a motor, coil or the like connected thereto. The heat protection circuit detects heat emitted from the output transistor through a semiconductor substrate in which the output transistor is formed.

Commonly, the heat protection circuit has a diode formed near the output transistor and a control circuit. The heat protection circuit detects the heat by detecting change in voltage of the diode.

When the heat protection circuit detects high temperature which may be caused by overcurrent flowing the output transistor and may break the output transistor soon, the heat protection circuit turns off the output transistor compulsorily to prevent the output transistor from being broken.

Lately, such the semiconductor device is required to have plural output portions each having an output transistor in a common semiconductor substrate. Each output portion drives a different load. Therefore, some of the output portions may drive their own loads at the same time. Moreover, a heat protection circuit may be provided in each output portion. In this situation, when a heat protection circuit in the predetermined output portion detects heat emitted and transmitted from a neighboring output portion, this protection circuit turn off the predetermined output portion that is to be protected by this protection circuit, even if the predetermined output portion does not emit heat that is higher than a predetermined level to turn off the predetermined output portion.

SUMMARY OF THE INVENTION

This invention has been conceived in view of the background as described above and an object of the invention is to provide a semiconductor device having heat protection circuits capable of protection of each output portion precisely.

According to a first aspect of the present invention, a semiconductor device has plurality of output portions and plurality of heat protection circuits each of which protects each of the output portions. In other words, a plurality of pairs having an output portion and a protection circuit are formed in a semiconductor substrate. Moreover, each pair of the output portion and the protection circuit is thermally isolated from each other by a heat transmission restraining portion formed between each of the pairs of the output portion and the heat protection circuit.

Preferably, the heat transmitting restrained portion is an insulation film.

Preferably, the output portion has a first electrode pad and a second electrode pad, and the heat protection circuit is formed adjacent to one of the first electrode pad and the second electrode pad since the one of them may emit heat most.

Other objects, features and advantages of the present invention will become more apparent from the following detailed description made with reference to the accompanying drawings.

DETAILED DESCRIPTION OF THE PREFERRED EMBODIMENTS

Figure 1:
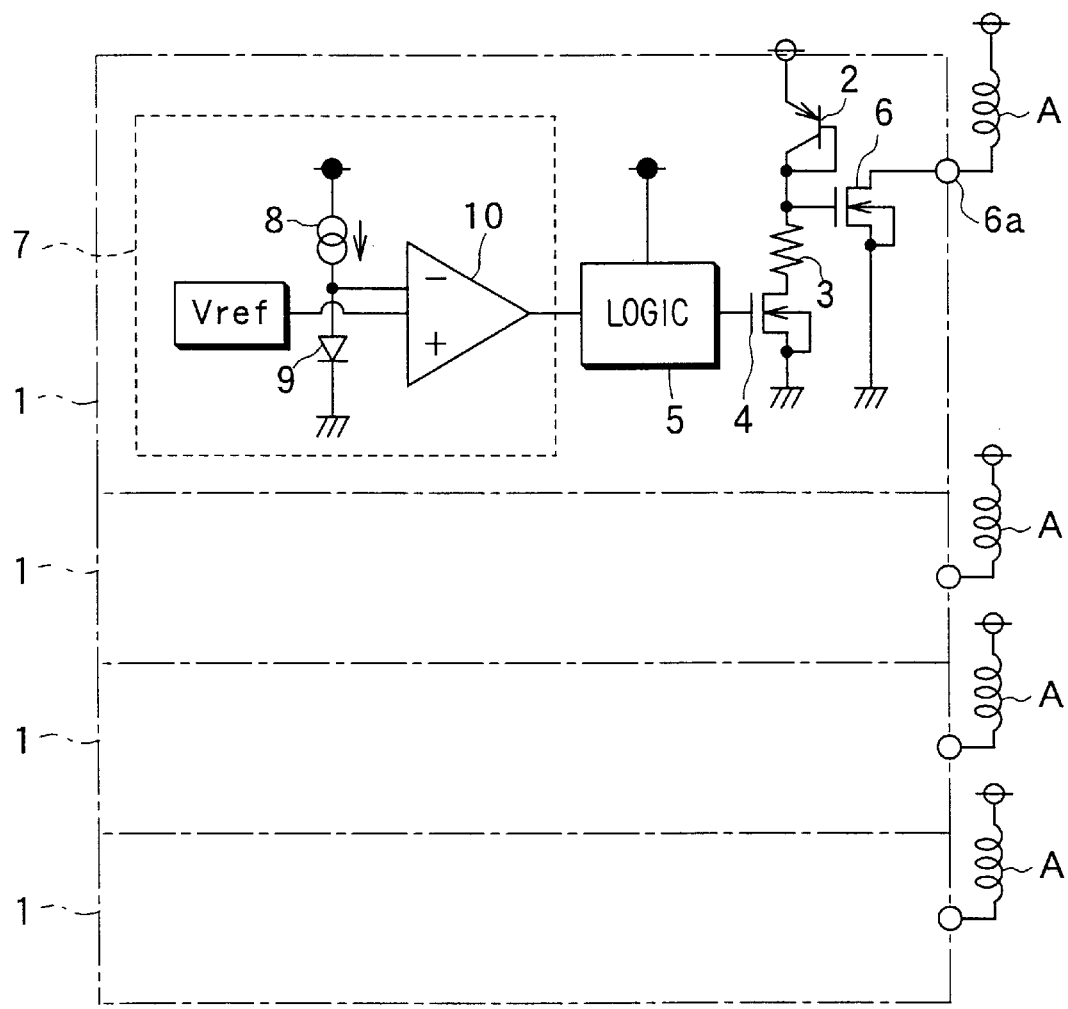
FIG. 1 is a schematic circuit diagram of a semiconductor device.

Specific embodiments of the present invention will now be described hereinafter with reference to the accompanying drawings in which the same or similar component parts are designated by the same or similar reference numerals.

Referring to FIG. 1, a semiconductor device has plural output circuits 1. Each output circuit 1 drives a different load A. Each of the plural output circuits 1 has a similar circuit diagram with each other. All of the plural output circuits 1 are formed in a common semiconductor substrate.

The output circuit 1 has a drive transistor 2, a resistor 3, a MOSFET 4, a logic portion 5, a lateral power transistor 6 (herein after, LDMOS) as a semiconductor switching element, and a heat protection circuit 7.

The MOSFET 4 is connected to the drive transistor 2 through the resistor 3. The drive transistor 2, the resistor 3, and the MOSFET 4 are supplied voltage from an external power supply. A gate terminal of the MOSFET 4 is connected to the logic circuit 5, and the MOSFET 4 is controlled by the logic circuit 5 to change a potential at a connection point between the drive transistor 2 and the resistor 3.

A gate terminal of the LDMOS 6 is connected to the connection point. As a result, the LDMOS 6 is turn on/off by the logic circuit 5 to control current flowing the load A through an output terminal 6a. The LDMOS emits heat caused by current flowing therethrough when the LDMOS is turned on. Incidentally, the load 6 is a solenoid for driving a magnetic valve, for example. The LDMOS 6 emits heat as a heat emitting element while being turned on.

The heat protection circuit 7 is provided at each of the output circuits, respectively. Therefore, a pair of the LDMOS 6 as the semiconductor switching element and the heat protection circuit 7 is provided in each output circuit 1.

The heat protection circuit 7 has a constant current supplying circuit 8, and a diode 9 as a heat detecting element that is supplied current from the constant current supplying circuit 8. Moreover, the heat protection circuit 7 has a comparator 10. An inverted input of the comparator 10 is connected to an anode of the diode 9, and a non-inverted input of the comparator 10 is connected to a reference voltage generating portion. The diode 9 has a negative characteristic in which voltage drop at the anode thereof becomes small when the diode is heated up by the heat emitted from the LDMOS 6. Therefore, when voltage at the anode of the diode 9 is dropped by the heat under a reference voltage generated at the reference voltage generating portion, the comparator 10 outputs a high level signal that indicates the diode 9 detects high temperature to turn off the LDMOS 6. Accordingly, the logic circuit 5 turns off the LDMOS 6 by turning off the MOSFET 4 when receiving the high level signal from the comparator 10. Thus, the LDMOS 6 is protected from being broken down by the heat.

A schematic cross sectional view of the LDMOS 6 and diode will be described with reference to FIG. 2.

Basically, the output circuits are formed in a SOI substrate 14. The SOI substrate 14 has a supporting substrate 11 and an activation layer (p-type silicon layer) 13 with an insulator layer (silicon oxide layer) 12 interposed therebetween.

Figure 2:
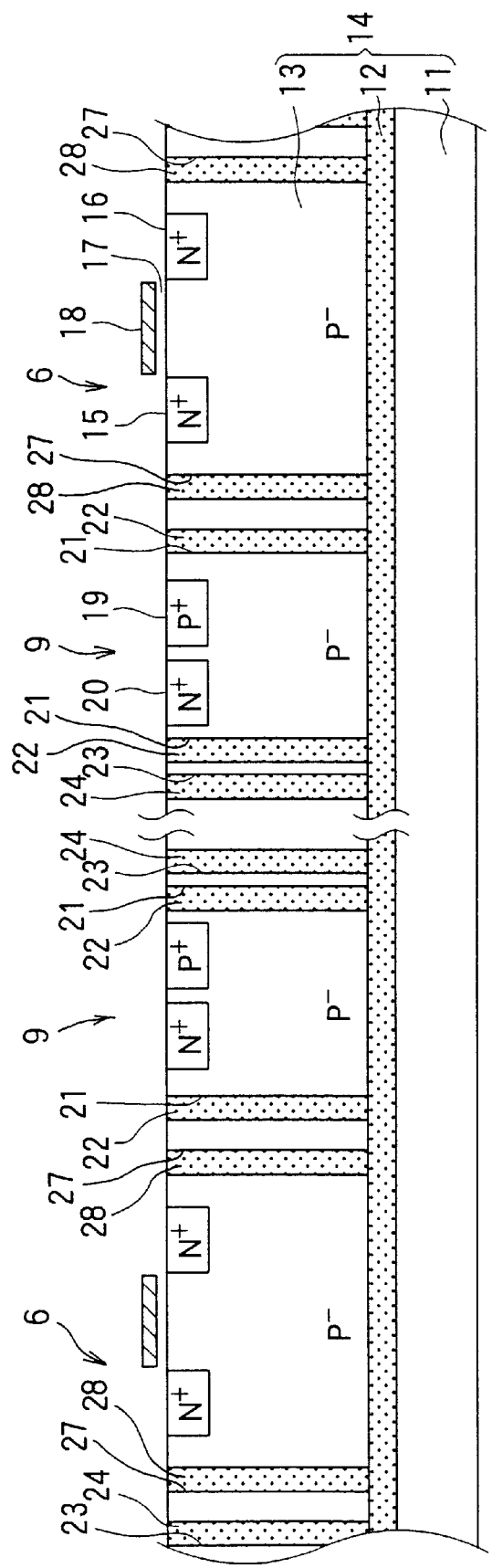
FIG. 2 is a schematic cross sectional view of the semiconductor device.

Two pairs of the LDMOS 6 and the diode 9 are shown in FIG. 2. The LDMOS 6 has an $n^+$-type source region 15 and an $n^+$-type drain region 16 disposed away from the source region 15 both formed at a surface of the activation layer 13, and a gate electrode 18 disposed between the source region 15 and the drain region 16 and disposed on a channel region located between the source region 15 and the drain region 16. The diode 9 has a $p^+$-type region 19 and an $n^+$-type region 20 both formed at a surface of the activation layer 13.

The LDMOS 6 is surrounded by a trench 27 formed in the activation layer 13 and an insulation film 28 formed in the trench 27 to be isolated from other portions of the activation layer 13. The diode 9 is surrounded by a trench 21 formed in the activation layer 13 and an insulation film 22 formed in the trench 21.

Plural output circuits 1 each having the pair of the LDMOS 6 and the diode 9 are formed in the SOI substrate 14. Each diode 9 is disposed adjacent to each LDMOS 6 in each output circuit 1. Moreover, a pair of the LDMOS 6 surrounded by the trench 27 with the insulation film 28 and the diode 9 surrounded by the trench 21 with the insulation film 22 is surrounded by an outer trench 23 formed in the activation layer and an insulation film 24 formed in the outer trench 23 in each output circuit 1.

Consequently, since the plurality of output circuits 1 each of which has the pair of the LDMOS 6 and the diode 9 are isolated from each other, heat emitted at a predetermined output circuit 1 is restrained from being transmitted to the adjacent output circuit 1 by an isolation structure described above. Incidentally, all of the trenches 21, 23, 27 are formed at a trench manufacturing step and reach to the insulating layer 12 from a surface of the activation layer 13. Similarly, all of the insulation films 22, 24, 28 are formed at a film manufacturing step.

Figure 3:
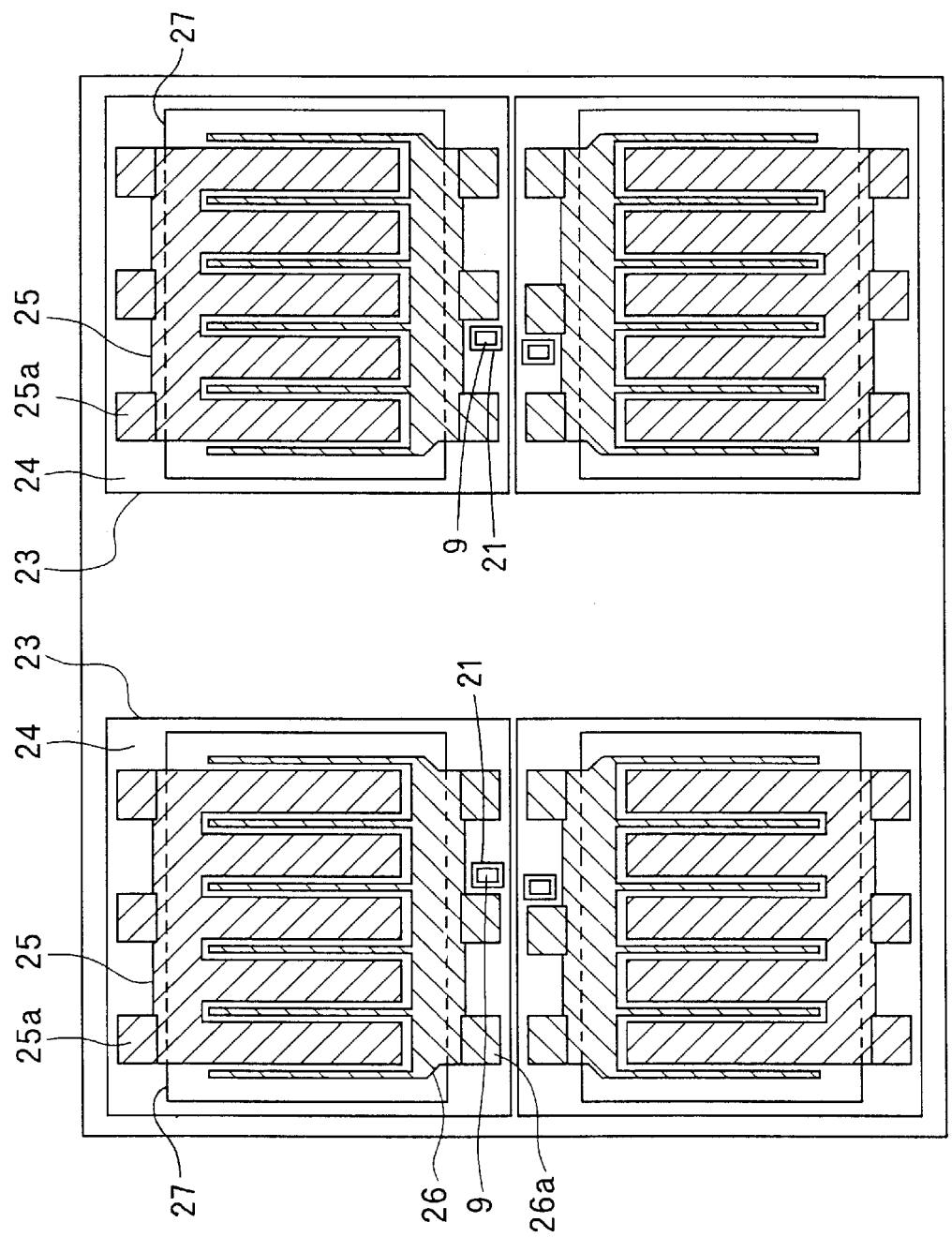
FIG. 3 is a schematic plan view of the semiconductor device.

FIG. 3 shows a pattern layout of the semiconductor device described above. The source region 15 and the drain region 16 are connected to a source electrode 25 and a drain electrode 26, respectively. The source electrode 25 and the drain electrode 26 have a comb shape with teeth, respectively. Moreover, the source electrode 25 and the drain electrode 26 are disposed so as to engage with each other on the activation layer 13. Source pads 25a of the source electrode 25 are formed at a teeth supporting portion of the comb-shaped source electrode 25 that supports the teeth. Similarly, drain pads 26a of the drain electrode 26 formed at a teeth supporting portion of the comb-shaped source electrode 26 that supports the teeth.

Incidentally, the source electrode 25 and the drain electrode 26 are made of, for example, aluminum, and can be formed by a method explained in U.S. Pat. No. 5,672,894 filed on Oct. 19, 1995, hereby incorporated by reference. Further, the LDMOS 6 has a structure explained in U.S. Pat. No. 6,104,076 filed on Nov. 15, 1996, hereby incorporated by reference.

The drain pads 26a is one of highest temperature portion of the LDMOS 6 when the current flows the LDMOS 6 since the drain pads 26a constitute a current path in the LDMOS 6. Therefore, the diode 9 is disposed adjacent to one of the drain pads 26a to detect the heat precisely.

As described above, the heat protection circuit 7 is provided at every output circuit 1, and each pair of the LDMOS 6 and the diode 9 are thermally isolated from each other by the trench 23 and the insulation film 24. Therefore, even when one of the LDMOSs 6 emits heat exceeding a threshold level and is turned off by the heat, the other LDMOSs 6 are not turned off by that heat, and work properly to drive the loads A. Namely, each output circuit 1 is not affected by other output circuits 1. That is, each of the plural output circuits 1 can work independently of each other in the common substrate.

Figure 4:
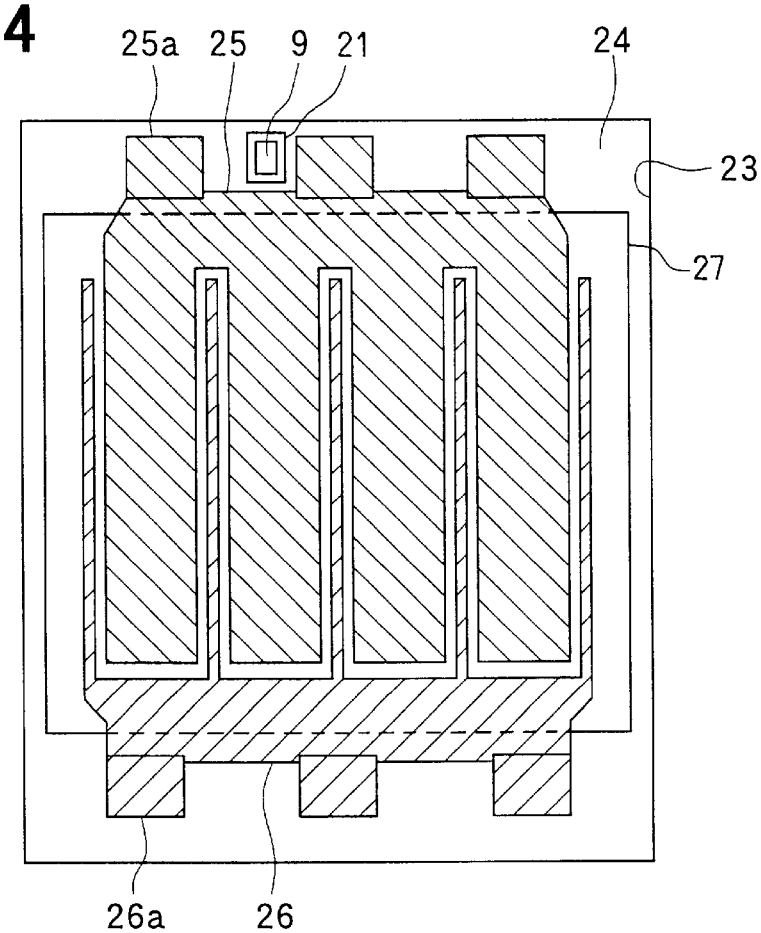
FIG. 4 is a schematic plan view of element region having a LDMOS and a heat detecting diode showing a modification of a pattern of electrodes.

Modifications will be described with reference to FIGS. 4 and 5. The diode 9 may be disposed adjacent to the source pad 25a as shown in FIG. 4.

Figure 5:
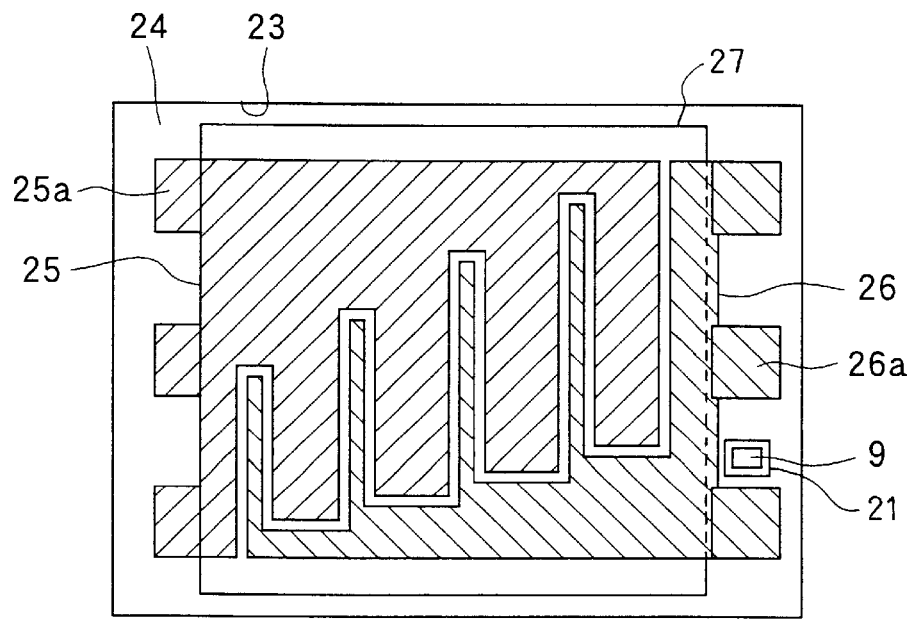
FIG. 5 is a schematic plan view of element region having a LDMOS and a heat detecting diode showing another modification of a pattern of electrodes.

The source pads 25a or the drain pads 26a may be formed at a side of an outermost tooth of the source electrode 25 or drain electrode 26 as shown in FIG. 5.

Incidentally, the heat emitting element is not limited to the LDMOS 6. For example, the heat emitting element may be a lateral IGBT, a bi-polar transistor or the like. The heat detecting element is not limited to the diode 9. For example, the heat detecting element may be a poly-Si diode or a poly-Si resistor which has characteristics of temperature dependency.

While the present invention has been shown and described with reference to the foregoing preferred embodiment, it will be apparent to those skilled in the art that changes in form and detail may be made therein without departing from the scope of the invention as defined in the appended claims.

What is claimed is:

1. A semiconductor device comprising:

a semiconductor substrate;

a plurality of output portions formed in the semiconductor substrate, each of the plurality of output portions allowing current flowing through a load;

a plurality of heat protection circuits each of which is formed adjacent to a corresponding output portion of the plurality of output portions to form an element region with the corresponding output portion, each of the plurality of heat protection circuits being for detecting heat emitted from the corresponding output portion, and for stopping the current from flowing through the corresponding output portion when the heat exceeds a threshold value, and a plurality of heat transmission restraining portions each of which formed between adjacent two of element regions, and each of the plurality of heat transmission restraining portions thermally isolating each of the element regions.

2. A semiconductor device according to claim 1, wherein each of the plurality of heat transmission restraining portions has an insulation film.

3. A semiconductor device according to claim 1, wherein the semiconductor substrate has a base substrate and an activation layer with an insulating film interposed therebetween, the plurality of output portions and the plurality of the heat protection circuits are formed in the activation layer, each of the plurality of heat transmission restraining portions has a trench extending from a surface of the activation layer to the insulating film, and the insulation film is formed in the trench.

4. A semiconductor device according to claim 1, each of the output portions has a semiconductor switching element having a first terminal and a second terminal to flow the current therethrough, each of the first terminal and the second terminal has a pad, and each of the protection circuit is formed close to the pad of one of the first terminal and the second terminal.

5. A semiconductor device comprising:
a plurality of element regions formed in a semiconductor substrate, each of the plurality of element regions comprising:
an output portion allowing current flowing through a load; and
a heat protection circuit formed adjacent to the output portion for stopping the output portion from allowing the current flowing when heat emitted from the output portion exceeds a threshold value;
a plurality of heat transmission restraining portions each of which is formed between adjacent two of the element regions, wherein the plurality of the element regions are thermally isolated from each other by the plurality of the heat transmission restraining portions.

6. A semiconductor device comprising:
a semiconductor substrate;
a plurality of output portions formed in the semiconductor substrate, each of the plurality of output portions is for permitting current to flow through a load; and
a plurality of heat protection circuits, each of which is formed at a corresponding output portion of the plurality of the output portions, wherein:
the each of the plurality of heat protection circuits stops the corresponding output portion from permitting the current to flow when a temperature of the corresponding output portion exceeds a threshold value; and
an outer insulated trench surrounds the each of the plurality of heat protection circuits and the corresponding output portion for providing thermal isolation.

7. The semiconductor device of claim 6, wherein each of the output portions includes a respective output portion insulated trench surrounding the each of the plurality of output portions for providing device isolation.

8. A semiconductor device comprised of a plurality of output circuits formed in an SOI substrate, each of the plurality of output circuits comprising:
a semiconductor switching element for supplying current to a load;
a heat protection circuit operatively connected to the semiconductor switching element for switching the semiconductor switching element to an off state when the semiconductor switching element reaches a predetermined temperature; and
an outer insulated trench surrounding the each of the plurality of output circuits for substantially restraining heat transmission from an adjacent one of the plurality of output circuits.

9. The semiconductor device of claim 8, wherein the each of the plurality of output circuits further comprises a heat protection circuit insulated trench surrounding the heat protection circuit for providing device isolation.

10. The semiconductor device of claim 8, wherein the each of the plurality of output circuits further comprises a semiconductor switching element insulated trench surrounding the semiconductor switching element for providing device isolation.

11. The semiconductor device of claim 8, wherein the semiconductor switching element comprises a source electrode and a drain electrode, the source electrode includes one or more source pads and the drain electrode includes one or more drain pads.

12. The semiconductor device of claim 11, wherein the heat protection circuit is disposed in close proximity to one of the one or more drain pads.

13. The semiconductor device of claim 11, wherein the heat protection circuit is disposed in close proximity to one of the one or more source pads.

* * * * *